United States Patent
Chan et al.

(10) Patent No.: US 6,939,814 B2
(45) Date of Patent: Sep. 6, 2005

(54) INCREASING CARRIER MOBILITY IN NFET AND PFET TRANSISTORS ON A COMMON WAFER

(75) Inventors: Victor Chan, Poughkeepsie, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/695,754

(22) Filed: Oct. 30, 2003

(65) Prior Publication Data

US 2005/0093078 A1    May 5, 2005

(51) Int. Cl.[7] .............................................. H01L 21/31
(52) U.S. Cl. ...................... 438/778; 438/783; 438/788; 438/791
(58) Field of Search ................................ 438/778, 783, 438/788, 791, 199

(56) References Cited

U.S. PATENT DOCUMENTS

| | | | |
|---|---|---|---|
| 6,573,172 B1 * | 6/2003 | En et al. ...................... | 438/626 |
| 2003/0040158 A1 * | 2/2003 | Saitoh ........................ | 438/279 |
| 2004/0075148 A1 * | 4/2004 | Kumagai et al. ........... | 257/369 |
| 2004/0104405 A1 * | 6/2004 | Huang et al. ............... | 257/199 |
| 2004/0113217 A1 * | 6/2004 | Chidambarrao et al. .... | 257/415 |

\* cited by examiner

*Primary Examiner*—Trung Dang
(74) *Attorney, Agent, or Firm*—Whitham, Curtis & Christofferson, P.C.; Ira D. Blecker

(57) ABSTRACT

Enhanced carrier mobility in transistors of differing (e.g. complementary) conductivity types is achieved on a common chip by provision of two or more respective stressed layers, such as etch stop layers, overlying the transistors with stress being wholly or partially relieved in portions of the respective layers, preferably by implantations with heavy ions such as germanium, arsenic, xenon, indium, antimony, silicon, nitrogen oxygen or carbon in accordance with a block-out mask. The distribution and small size of individual areas of such stressed structures also prevents warping or curling of even very thin substrates.

11 Claims, 3 Drawing Sheets

INCREASING CARRIER MOBILITY IN NFET AND PFET TRANSISTORS ON A COMMON WAFER

BACKGROUND OF THE INVENTION

1. Field of the Invention

The present invention generally relates to the manufacture of transistors for integrated circuits and, more particularly, to the production of complementary pairs of field effect transistors of enhanced performance at extremely small scale.

2. Description of the Prior Art

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increase of possible clock rates while the reduction in element size necessary for increased integration density increases to ratio of functionality which can be provided on a chip to the costs of production (e.g. wafer/chip area and process materials) per chip and, potentially, the cost of devices containing the chips by reducing the number of inter-chip and inter-board connections required.

However, the immutable material properties and physical effects by which transistors and other elements function is invariably compromised as the scale of integrated circuit elements is reduced. In response, many improvements in transistor design have been made to maintain suitable levels of performance of these elements, for example, lightly doped drain (LDD) structures (now generally referred to as extension implants since heavier doping levels have been required in current minimum feature size regimes), halo implants and graded impurity profiles have been employed to counteract short channel and punch-through effects and the like, particularly in field effect transistors (FETs) which have become the active device of choice for all but the highest frequency devices. Reduction in device scale has also required operation at reduced voltages to maintain adequate performance without device damage even though operating margins may be reduced.

A principal factor in maintaining adequate performance in field effect transistors is carrier mobility which affects the amount of current or charge which may flow (as electrons or holes) in a doped semiconductor channel under control of a voltage placed on a gate electrode insulated from the channel by a very thin dielectric. Reduced carrier mobility in an FET reduces not only the switching speed/slew rate of a given transistor but also reduces the difference between "on" resistance and "off" resistance. This latter effect increases susceptibility to noise and reduces the number of and/or speed at which downstream transistor gates (capacitive loads) can be driven. Even during the early development of metal-oxide-semiconductor (MOS) field effect transistors and complementary MOS (CMOS) devices (widely used in integrated circuits at the present time), in particular, carrier mobility was a design concern and often required a PMOS device to be made several times as large as a complementary NMOS device with which it was paired in order to obtain reasonably symmetrical operation of the CMOS pair in view of the difference in carrier mobility between electrons, the principal carrier in NMOS devices and holes, the principal carrier in PMOS devices. In more recent and critical designs, it has been shown that carrier mobility degrades in deeply scaled bulk MOS devices due to the heavy doping required to suppress short-channel effects and ultra-thin oxide effects.

It has also been shown theoretically and confirmed experimentally that mechanical stress in the channel region of an FET can increase or decrease carrier mobility significantly; depending on the sign of the stress (e.g. tensile or compressive) and the carrier type (e.g. electron or hole). Tensile stress increases electron mobility and decreases hole mobility while compressive stress increases hole mobility while decreasing electron mobility in the doped semiconductor crystal lattice forming the transistor channel. This phenomenon is well-recognized and theories concerning the physical effects by which it occurs are, in any event, unimportant to its exploitation. In this regard, numerous structures and materials have been proposed for inducing tensile or compressive force in a semiconductor material, such as shallow trench isolation (STI) structures, gate spacers, etch-stop layers and silicide which are generally included in integrated circuit designs. It is also known to induce persistent stresses in semi-conductors for structural reasons. For example, U.S. Pat. Nos. 6,069,049 and 6,399,976 teach that applying a film around a structure and then reducing volume of the film to compress the structure and thus prevent the propagation of defects. However, at the present state of the art, such structures can generally be made of only one type; to produce tensile stress or compressive stress but not both. Therefore, in integrated circuit designs using both PFET and NFET transistors and CMOS technology (in which the logic is implemented principally by complementary PMOS and NMOS transistor pairs), in particular, an enhancement of carrier mobility on one type of transistor was necessarily accompanied by degradation of carrier mobility in the other or complementary type of transistor; yielding little, if any, net performance gain although theoretically capable of improving symmetry of operation of CMOS circuits. However, the stress levels produced by such structures were generally difficult to control particularly since the structure dimensions are often dictated by other design concerns, such as isolation and breakdown voltages.

Additionally, stress of a single type produced by such structures tends to cause warping or curling of the wafer or substrate, particularly if thin (as is the current trend), which compromises later lithographic processes such as the formation of contacts and connections or, in severe cases, chip or wafer cracking; reducing manufacturing yield or (in rare cases) reliability after being put into service. Moreover, such structures may present severe topography on the surface of a chip or wafer which may compromise subsequent manufacturing processes.

SUMMARY OF THE INVENTION

It is therefore an object of the present invention to provide a method and structure which can provide tensile and compressive stresses on different electronic element structures on the same chip or wafer.

It is another object of the invention to provide a method and structure which can be easily and repeatably formed with high manufacturing yield which does not adversely affect the chip or wafer or earlier- or later-conducted manufacturing processes in which tensile and compressive stress levels may be readily controlled.

In order to accomplish these and other objects of the invention, a method of adjusting carrier mobility for different semiconductor conductivities on the same chip is provided comprising steps of providing a first layer of material providing a first stress level on a portion of a surface of a chip, selectively reducing the first stress level of a portion of the first layer of material, providing a second layer of material providing a second stress level on a portion of a surface of the chip, and selectively reducing the second stress level of a portion of the second layer of material.

In accordance with another aspect of the invention, an integrated circuit is provided comprising first and second circuit elements such as transistors, and first and second stressed layers, each stressed layer having stress relieved in selected portions thereof.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
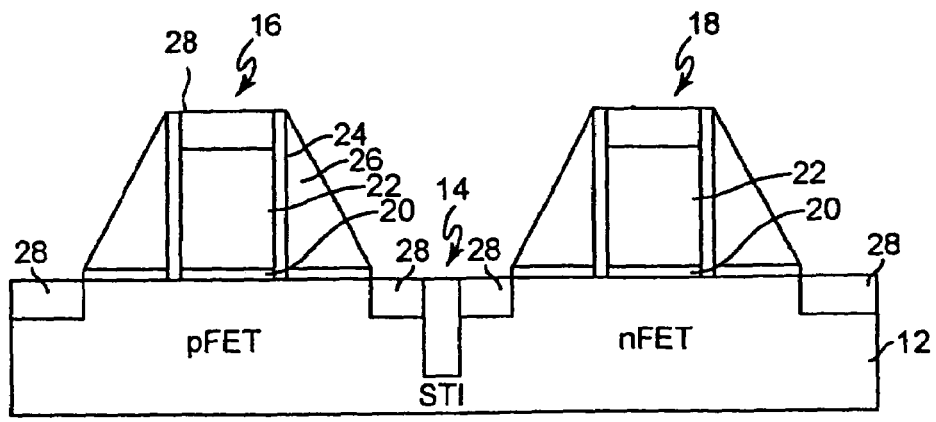
FIG. 1 is a cross-sectional view of an exemplary CMOS pair of NMOS and PMOS transistors at a stage of manufacture following production of silicide to enhance contact formation.

Referring now to the drawings, and more particularly to FIG. 1, there is shown, in cross-section, an exemplary pair of complementary NMOS and PMOS transistors such as might comprise a CMOS pair in a portion of an integrated circuit. These transistors have been completed through the formation of silicide on the source, drain and gate regions to reduce resistance of contacts to be later applied thereto. The method of formation of these transistors and the particulars of their structures are unimportant to an understanding of the invention or its successful practice. It should be understood that while FIG. 1 illustrates transistors prior to the application of the invention thereto, the illustration is intended to be highly schematic for clarity and no portion of FIG. 1 is admitted to be prior art as to the invention.

In FIG. 1 and other Figures, the transistors 16, 18 are formed on substrate 12 (which may be relatively much thicker than depicted since the transistors are possibly deeply scaled, as is the preferred application of the invention). The transistors 16, 18 are isolated from each other by shallow trench isolation 14 which may also serve to define n-well and p-well regions of substrate 12. In this regard, transistors 16 and 18 are of complementary conductivity types and, accordingly, the portions of substrate 12 underlying these respective transistors are also oppositely doped.

The transistors are otherwise of similar construction; each having a gate dielectric 20, a gate electrode 22, a sidewall spacer structure 24, 26 and source, drain and gate silicide regions 28, as will be familiar to those skilled in the art. Source and drain implant regions and extension and/or halo implant regions may be included as may be desired, as is well-known in the art.

It should be appreciated in the course of the following discussion of FIGS. 2–9 that the embodiment which will be described is that which is expected to be the most advantageous in most applications and integrated circuit designs and thus preferred as well as being an embodiment which will allow the most complete appreciation of the invention to be conveyed. That is, the embodiment and variants thereof which will be described below will illustrate application of variable amounts of tensile and compressive stresses to be respectively applied to adjacent transistors on a single chip and provide other meritorious functions. However, the principles of the invention described in connection with this embodiment can also be applied to provide any desired amount of stress of either sign to adjacent structures of any type in any design. Further, the principles of the invention, while described in connection with an etch-stop layer, can be applied to other structures which may have other functions to provide similar effects on carrier mobility.

It should also be understood that application of a stressed film to a surface of a body will cause a stress of the opposite sign in that body. That is, a tensile film will develop a compressive force in the body that underlies the film. However, when such forces are localized, the sign of the stress in adjacent areas will be of opposite sign. Thus, a compressive stress in a region of a body of material will be accompanied by an adjacent region of tensile stress and vice-versa.

Figure 2:
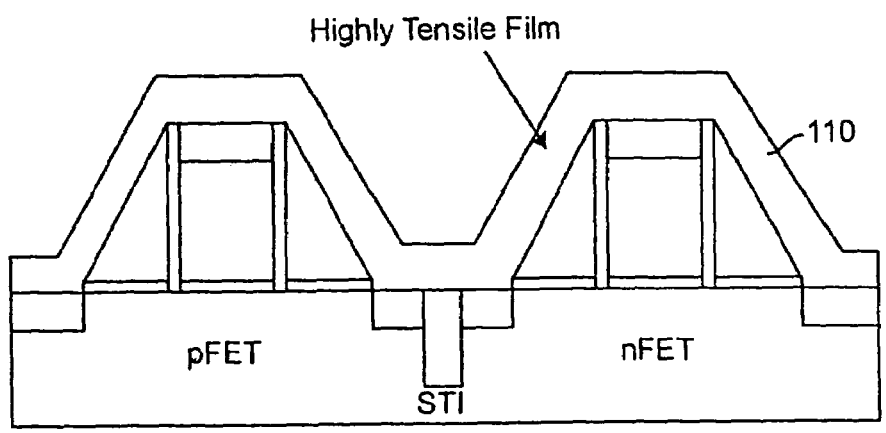
FIG. 2 is a cross-sectional view of the exemplary CMOS pair of NMOS and PMOS transistors with a first etch-stop layer applied thereto.

FIG. 2 shows the structure of FIG. 1 after application of a highly stressed film 110 of material over the entire chip or any lesser portion thereof where it is desired to employ the invention. The highly stressed film is preferably silicon nitride ($Si_3N_4$) or silicon oxynitride ($Si_3O_xN_y$) or a combination of both. These materials can be deposited in a highly stressed form providing either tensile or compressional stress, depending on particular process parameters such as plasma power and gas flow rates. For example, Plasma Enhanced Chemical Vapor Deposition (PECVD) silicon nitride can be deposited at a relatively low temperature (e.g. 400° C. to 500° C.) with the stress level mainly controlled by plasma power; higher power, in general, yielding a more compressive stress. On the other hand, thermal CVD silicon nitride is deposited at a temperature above 600° C. and is normally tensile with stress readily controllable through a combination of deposition parameters including temperature and precursor flow rate and for which, empirical data is known. Film 110 is in the nature of an etch-stop layer which is generally provided in current integrated circuit designs. Therefore, provision of such a film 110 does not, itself, increase process complexity (although it is preferably performed a number of times in accordance with the invention).

Such a film facilitates formation of openings for connections to the source, drain and gate of respective transistors while avoiding damage thereto by etching a later applied layer which may not be of uniform thickness selectively to the etch-stop and then using the patterned later-applied layer as a mask for timed etching through the etch-stop and, preferably, selectively to the underlying silicide. However, deposition in a highly stressed form has been generally avoided to the extent possible since high stress films may peel off from the substrate if adhesion is not sufficient although stress in film 100 does not compromise functioning as an etch stop. (Adhesion is generally dependent on the underlying material and adhesion enhancements are not generally necessary for the successful practice of the invention (e.g. for FETs formed of materials currently in common use) but could be used if needed and regulated in thickness to transfer forces in the intended manner.)

In this preferred case, and for purposes of clarity, a high tensile stress form of etch-stop material is arbitrarily assumed. The deposition is preferably isotropic to provide a substantially constant layer thickness which extends over the substrate in front and in back of the gate as well as the front and back gate surfaces which are in front and in back of the plane of the page of FIG. 2. Therefore, stress is efficiently applied to the substrate surface as well as the gate electrode volume. The thickness of the layer is important to the practice of the invention to provide the desired stress level without peeling and transfer stresses from an overlying layer as well as to function as an etch stop. In view of these considerations, a thickness between 300 Å and 2000 Å is generally preferred and adequate. Thus, the invention may be successfully practiced within a very wide range of thicknesses and corresponding developed stress levels and thus the particular thickness chosen is not otherwise critical to the practice of the invention.

Figure 3:
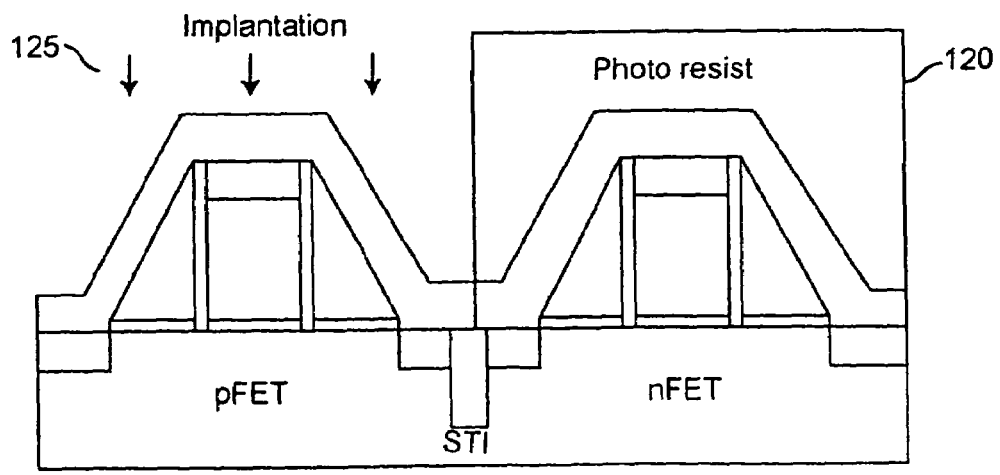
FIG. 3 is a cross-sectional view of the exemplary CMOS pair of NMOS and PMOS transistors with a block-out mask applied to the NFET.
Figure 4:
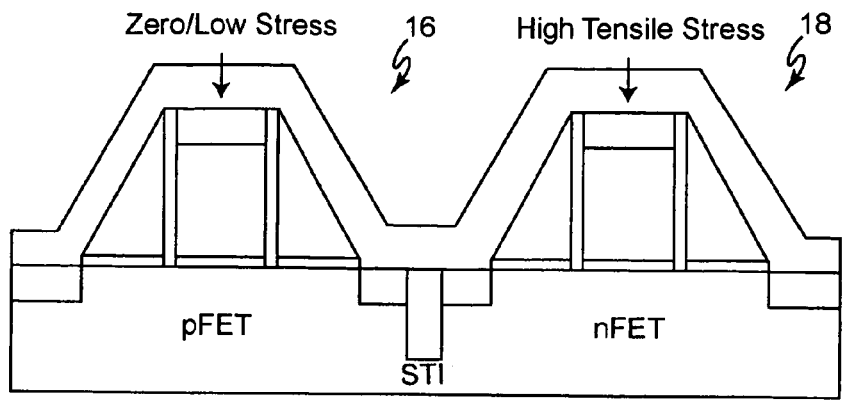
FIG. 4 is a cross-sectional view of the exemplary CMOS pair of NMOS and PMOS transistors after a first implantation process to the etch-stop layer.
Figure 5:
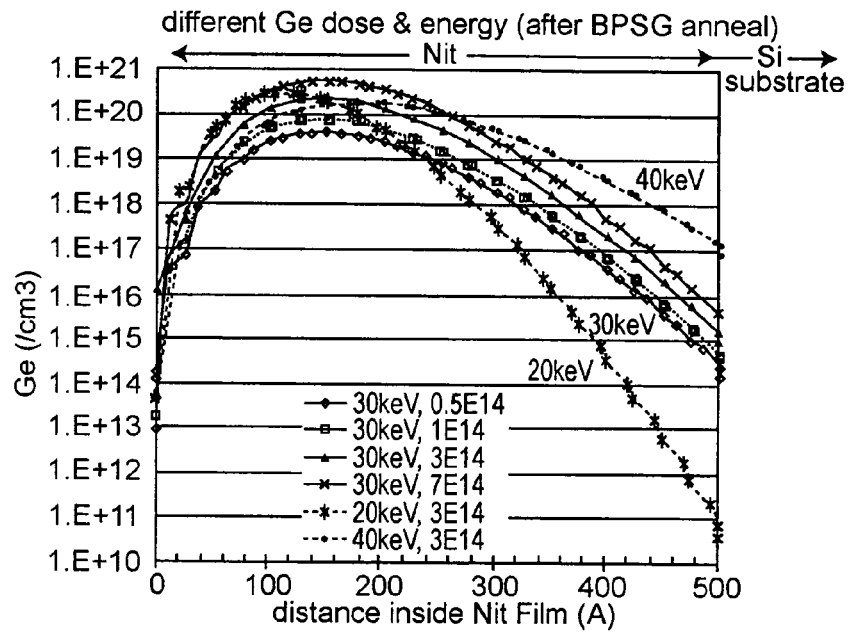
FIG. 5 is a graphical depiction of a plurality of germanium implantation processes illustrating implantation depth within a silicon nitride film for differing ion fluxes and energies.

As illustrated in FIG. 3, a blockout mask 120 is then applied over transistors which are to have carrier mobility altered by the stress applied by film 110, in this case the NFET 18 to which tensile stress is applied (causing compressive stress in the transistor channel) to increase electron mobility. Then, an ion implantation process (depicted by arrows 125) is carried out to reduce or relieve the stress imposed by film 110. Germanium is preferred for this purpose since it can break Si—N bonds and release the stress in the implanted region while being substantially contained in the film 110 (as illustrated in FIG. 5) which is of a sufficient thickness to provide the stress levels of interest while not significantly altering the insulating properties thereof. Experiments by the inventors have shown that such ion implantation can bring the stress levels in layer 110 to substantially zero and that other relatively heavy ions such as arsenic, xenon, indium, antimony can be used. (Even silicon and nitrogen have been successfully employed for the purpose; indicating that oxygen and carbon may also be good candidate materials for this purpose.) Thus the tensile stress can be selectively released (fully or partially) over the PFET transistor while being maintained over the NFET as depicted in FIG. 4. The implantation dose and energy can be chosen to maintain the implantation substantially within the film 110 to avoid affecting the transistor structure, as illustrated in FIG. 5.

Figure 6:
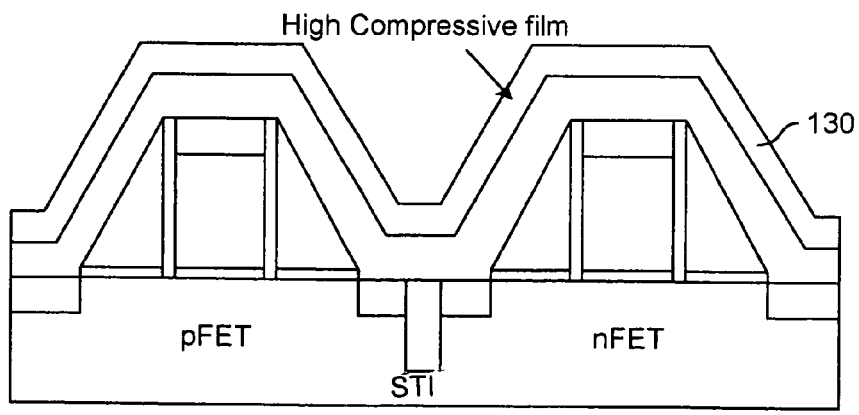
FIG. 6 is a cross-sectional view of the exemplary CMOS pair of NMOS and PMOS transistors with a second etch-stop layer applied thereto.
Figure 7:
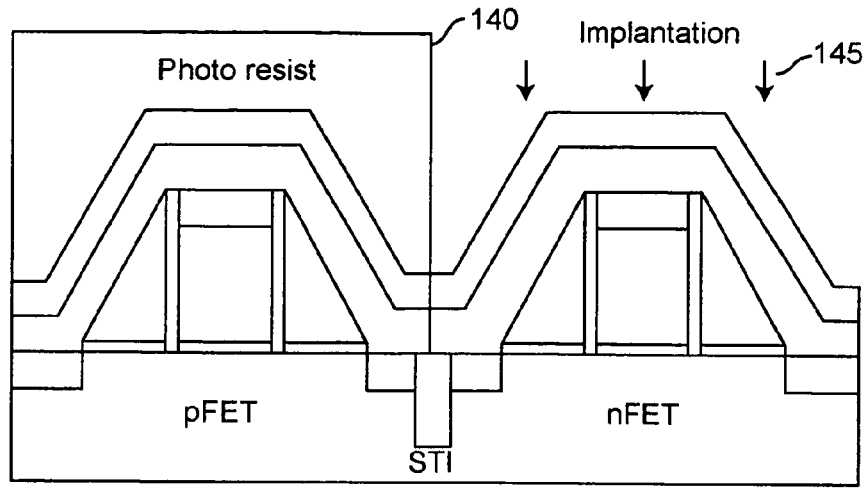
FIG. 7 is a cross-sectional view of the exemplary CMOS pair of NMOS and PMOS transistors with a block-out mask applied to the PFET.
Figure 8:
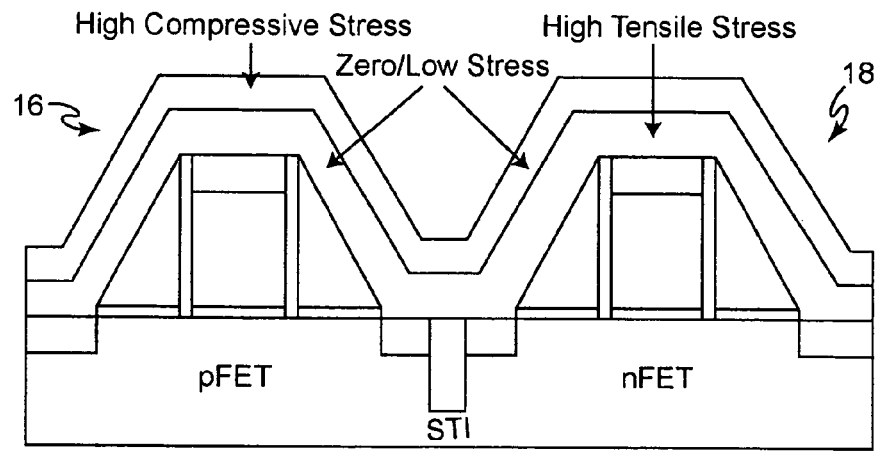
FIG. 8 is a cross-sectional view of the exemplary CMOS pair of NMOS and PMOS transistors after a second implantation process to the second etch-stop layer.

Then, as illustrated in FIGS. 6 and 7, the process is repeated to apply, for example, compressive stress to the PFET 16. Specifically, another etch-stop film 130 is deposited by a process producing compressive stress is deposited to an equal or different thickness to develop a bi-level etch-stop film over and surrounding the transistors 16, 18. The material of film 130 is preferably but need not be the same material as film 110 but applied by a different process and/or with different process parameters. Again, the thickness of film 130 is determined in connection with the thickness of film 110 (as to etch-stop function and any level of residual persistent forces in film 110) and the amount of compressive stress to be developed for the desired hole mobility. Then, as illustrated in FIG. 7, the PFET 16 is then covered with a blockout mask 140 and a further ion implantation process 145 performed to reduce stress in film 130. Again, in accordance with FIG. 5, the ion dose and energy can be chosen to maintain the implanted ions within film 140 (and the effects of any implantation into film 110 to be projected and compensated in the overall process. The stress imposed by film 130 can thus be partially or fully released with no or only minor effects on the tensile stresses in film 110; resulting in the structure illustrated in FIG. 8 in which, for example, high compressive stress is applied to PFET 16 to increase hole mobility while high tensile stress is applied to NFET 18 to increase electron mobility.

It should be appreciated that the order of films 110, 130 and their respective and relative compressive and/or tensile qualities are essentially arbitrary. However, it should be appreciated that forces developed in film 130 are transferred to the transistor channel through a substantially unstressed portion of film or layer 110 as shear forces which may affect the distribution and gradients of stress in substrate 12, particularly in regions where stresses change from tensile to compressive or vice-versa. Any such effect will vary somewhat with thickness of film 110 but, in general, will be small and of little significance in the transistor channels.

Figure 9:
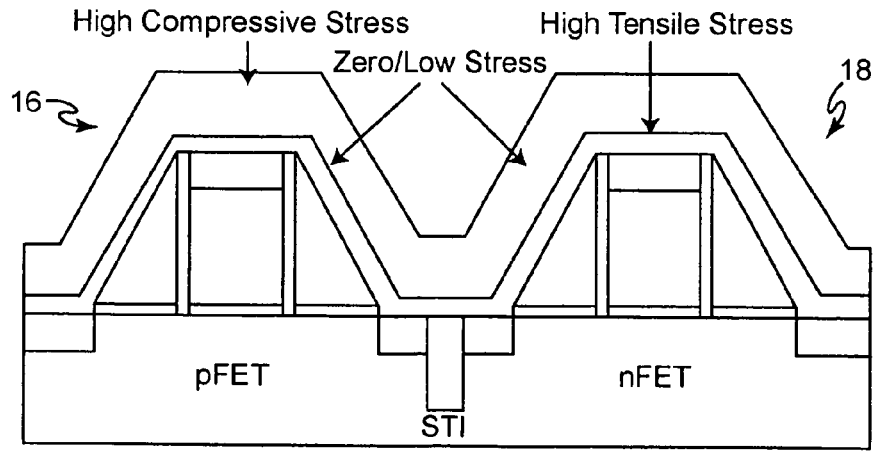
FIG. 9 is a cross-sectional view of the exemplary CMOS pair of NMOS and PMOS transistors showing how relative thickness of the first and second etch-stop layer may be used to regulate the relative amount of compressive and tensile stresses applied.

Hole and electron carrier mobility may thus be enhanced or regulated to any desired degree within the range of the effect of tensile and compressive force thereon which can be provided by an appropriate thickness and deposition process of the respective films 110, 130, generally in the range of −2.0 to +2.0 GPa. The preferred technique of providing different levels of stress in respective transistors 16, 18 is by providing differing thickness of films 110 and 130 such that the stress relief by ion implantation can be carried out to substantial completion and full stress removal (since the ion implantation process may be less easily regulated or may require collection of substantial amounts of empirical data for partial stress relief) as shown in FIG. 9. As illustrated, the structure of FIG. 9 would provide a greater degree or amount of (compressive) stress for PFET 16 than the degree or amount of (tensile) stress provided for NFET 18 and thus would tend to equalize respective electron and hole mobilities in the two transistors where other expedients for doing so may not be as easily or repeatably applied. Therefore, the invention is particularly applicable to CMOS technologies where the transistors are deeply scaled to the point that carrier mobilities are compromised.

In view of the foregoing, it is seen that the invention provides a method and structure for controlling or improving the carrier mobility in both NFETs and PFETs on the same chip without compromise of manufacturing yield or adverse effects on previously formed structures or later performed processes and which can be readily controlled without compromising manufacturing yield and requiring only a few additional but well-developed processes. Since compressional and tensile forces, although potentially substantial, are applied over relatively small respective areas (in comparison, for example, to chip thickness) there is no tendency of the chip or wafer to warp or curl. Further, since the films 110, 130 are applied in layers of substantially uniform thickness, severity of topography is not increased. It should be appreciated that an "improvement" in carrier mobility may generally connote an increase therein, a reduction in carrier mobility may be provided by the same process merely by exchanging the etch-stop layer deposition processes relative to the transistor types to thus reverse the types of tensile or compressional forces are applied to respective transistor conduction/impurity types.

While the invention has been described in terms of a single preferred embodiment, those skilled in the art will recognize that the invention can be practiced with modification within the spirit and scope of the appended claims.

What is claimed is:

1. A method of adjusting carrier mobility for different semiconductor conductivities on the same chip comprising steps, in sequence, of:
    forming a first layer of material applying a first stress level on a first portion of a surface of a chip,
    selectively reducing said first stress level of a portion of said first layer of material, thereby reducing said first stress level on said first portion,
    forming a second layer of material applying a second stress level on a second portion of a surface of the chip said second stress level being different from said first stress level, and
    selectively reducing said second stress level of a portion of said second layer of material, thereby reducing said second stress level on said second portion.

2. The method as recited in claim 1, wherein said first stress level is tensile and said second stress level is compressive.

3. The method as recited in claim 1, wherein said step of providing a first layer is performed by plasma enhanced chemical vapor deposition.

4. The method as recited in claim 3, wherein said first stress level is developed in accordance with plasma power during said plasma enhanced chemical vapor deposition.

5. The method as recited in claim 1, wherein said step of providing said second layer is performed by thermal chemical vapor deposition.

6. The method as recited in claim 5, wherein said step of providing a first layer is performed by plasma enhanced chemical vapor deposition.

7. The method as recited in claim 6, wherein said first stress level is developed in accordance with plasma power during said plasma enhanced chemical vapor deposition.

8. The method as recited in claim 1, wherein one of said first layer of material and said second layer of material is silicon nitride or silicon oxynitride.

9. The method as recited in claim 1, including the further step of:
    forming two transistors in said portion of a surface of a chip prior to said steps of providing said first and second layers of material.

10. The method as recited in claim 1, wherein said step of providing a second layer of material results in a greater thickness than a thickness resulting for said step of providing a first layer of material.

11. The method as recited in claim 1, wherein said steps of reducing stress are performed by implanting ions of germanium, arsenic, xenon, indium, antimony, silicon, nitrogen, oxygen or carbon.

* * * * *